US008999061B2

(12) United States Patent
Ishibashi et al.

(10) Patent No.: US 8,999,061 B2
(45) Date of Patent: *Apr. 7, 2015

(54) METHOD FOR PRODUCING SILICON EPITAXIAL WAFER

(75) Inventors: Masayuki Ishibashi, Tokyo (JP); Tomonori Miura, Tokyo (JP)

(73) Assignee: Sumco Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/318,950

(22) PCT Filed: May 7, 2010

(86) PCT No.: PCT/JP2010/057795
§ 371 (c)(1),
(2), (4) Date: Jan. 5, 2012

(87) PCT Pub. No.: WO2010/128671
PCT Pub. Date: Nov. 11, 2010

(65) Prior Publication Data
US 2012/0090536 A1    Apr. 19, 2012

(30) Foreign Application Priority Data

May 8, 2009  (JP) ................................. 2009-113157

(51) Int. Cl.
*C30B 25/02*  (2006.01)
*H01L 21/306*  (2006.01)
*C30B 33/08*  (2006.01)
(Continued)

(52) U.S. Cl.
CPC .......... *H01L 21/30625* (2013.01); *C30B 33/08* (2013.01); *C30B 29/06* (2013.01); *C30B 25/02* (2013.01); *C30B 33/00* (2013.01); *H01L 21/02381* (2013.01); *H01L 21/02658* (2013.01); *Y10S 438/959* (2013.01)

(58) Field of Classification Search
CPC .............. C30B 25/02; H01L 21/30625; H01L 21/02381; H01L 21/02658
USPC .............................................. 438/607; 117/97
See application file for complete search history.

(56) References Cited

U.S. PATENT DOCUMENTS 3,436,259 A     4/1969 Regh et al.
5,885,334 A  *  3/1999 Suzuki et al. .................... 106/3
(Continued)

FOREIGN PATENT DOCUMENTS

DE        19704546       8/1998
JP        44-7642        4/1969
(Continued)

OTHER PUBLICATIONS

Germany Office action, dated Feb. 8, 2013 along with an english translation thereof.

*Primary Examiner* — Michael Kornakov
*Assistant Examiner* — Hua Qi
(74) *Attorney, Agent, or Firm* — Greenblum & Bernstein, P.L.C.

(57) ABSTRACT

The method for producing a silicon epitaxial wafer according to the present invention has: a growth step G at which an epitaxial layer is grown on a silicon single crystal substrate; a first polishing step E at which, before the growth step G, both main surfaces of the silicon single crystal substrate are subjected to rough polishing simultaneously; and a second polishing step H at which, after the growth step G, the both main surfaces of the silicon single crystal substrate are subjected to finish polishing simultaneously.

9 Claims, 8 Drawing Sheets

(51) Int. Cl.
*C30B 29/06* (2006.01)
*C30B 33/00* (2006.01)
*H01L 21/02* (2006.01)

(56) References Cited

U.S. PATENT DOCUMENTS

| | | | |
|---|---|---|---|
| 6,051,498 A | 4/2000 | Pietsch et al. | |
| 2002/0052064 A1 | 5/2002 | Grabbe et al. | |
| 2003/0008477 A1* | 1/2003 | Kang et al. | 438/458 |
| 2003/0054650 A1* | 3/2003 | Wenski et al. | 438/692 |
| 2003/0104698 A1 | 6/2003 | Taniguchi et al. | |
| 2005/0277278 A1* | 12/2005 | Maleville et al. | 438/607 |
| 2006/0197619 A1* | 9/2006 | Oishi et al. | 331/158 |
| 2007/0295265 A1* | 12/2007 | Kimura | 117/2 |
| 2008/0057324 A1* | 3/2008 | Nakahara et al. | 428/446 |

FOREIGN PATENT DOCUMENTS

| | | |
|---|---|---|
| JP | 8-17163 | 2/1996 |
| JP | 2000-243699 | 9/2000 |
| JP | 2002-254299 | 9/2002 |
| JP | 2003-77870 | 3/2003 |
| JP | 2005-209862 | 8/2005 |
| JP | 2006-54428 | 2/2006 |
| JP | 2007-214368 | 8/2007 |
| JP | 2008-088051 | 4/2008 |

* cited by examiner

Adjustment of haze level on the front surface

Remove of damages and depositions from the back surface

Microscope observation results of wafer back surface edges

Double side simultaneous polishing after epitaxial growth

After epitaxial growth

METHOD FOR PRODUCING SILICON EPITAXIAL WAFER

TECHNICAL FIELD

The present invention relates to a method for producing a silicon epitaxial wafer.

BACKGROUND ART

A production method is known which grows a vapor phase epitaxial layer on the surface of a silicon single crystal wafer processed through mirror polishing and then subjects the surface of the epitaxial layer to mirror polishing process (Patent Document 1). According to this production method, crown defects having occurred during the epitaxial growth are allowed to be removed and the flatness of the surface may be achieved.

PRIOR ART DOCUMENTS

Patent Documents

Patent Document 1: Examined Patent Publication No. H8-17163 (1996)

SUMMARY OF THE INVENTION

Problem to be Solved by the Invention

However, the above prior art production method may not solve the problems, such as degradation in flatness caused by damages on the back surface of the wafer and ununiformity in thickness of the epitaxial layer.

Problems to be solved by the present invention include providing a method for producing a silicon epitaxial wafer, in which the degradation in flatness caused by damages on the back surface of a wafer and ununiformity in thickness of an epitaxial layer are allowed to be suppressed.

Means for Solving the Problems

The present invention solves the above problems through providing a first double side polishing step at which both main surfaces of a silicon single crystal substrate are subjected to rough polishing simultaneously before a growth step at which an epitaxial layer is grown on the silicon single crystal substrate, while providing a second double side polishing step at which the both main surfaces of the silicon single crystal substrate are subjected to finish polishing simultaneously after the growth step.

Effects of the Invention

According to the present invention, the rough polishing in the first double side polishing step ensures the flatness of a wafer, and the final polishing in the second double side polishing step allows damages on the wafer back surface to be removed, thereby also allowing the thickness of the epitaxial layer to be even.

EMBODIMENTS FOR CARRYING OUT THE INVENTION

Hereinafter, embodiments of the present invention will be described with reference to the drawings.

Figure 1:
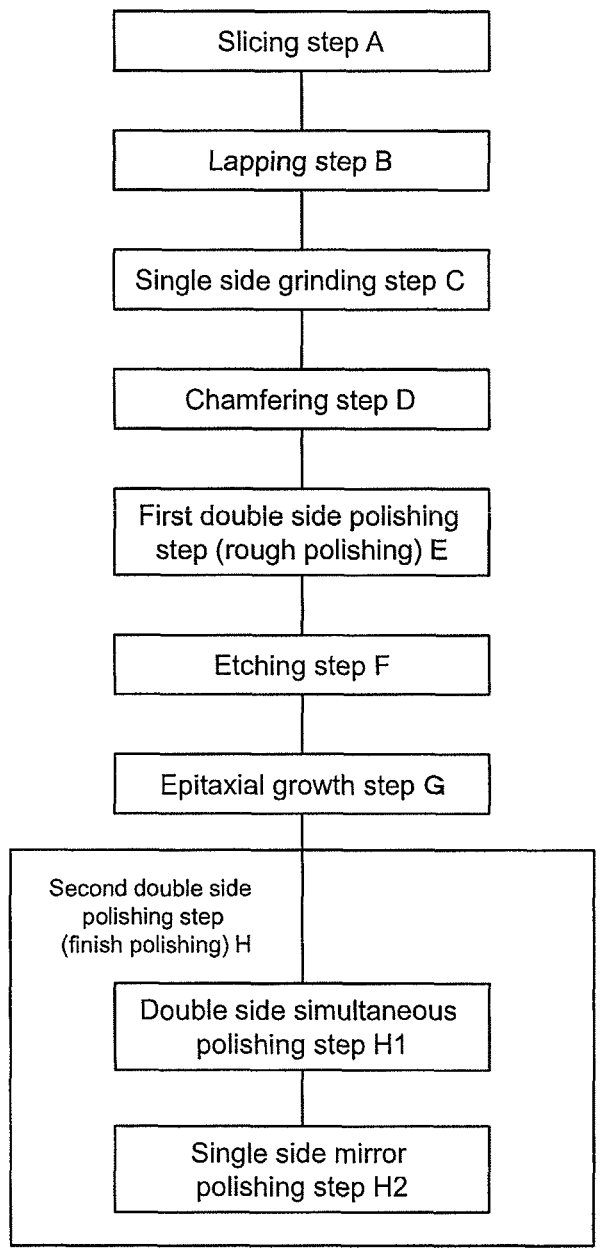
FIG. 1 is a process chart illustrating a method for producing silicon epitaxial wafers, to which one embodiment of the present invention is applied.

FIG. 1 is a process chart illustrating a method for producing silicon epitaxial wafers, to which one embodiment of the present invention is applied.

Describing at first one example of a pre-process for slicing step A, through Czochralski pulling up method, a p-type silicon single crystal ingot is produced which has the main axis orientation of <100> and the diameter of 305 mm, and this ingot is peripherally ground into the diameter of 300 mm and then subjected to notch forming thereafter being cut into a plurality of blocks with resistivity of 5 to 10 mΩcm.

Note that, as the main axis orientation of the silicon single crystal, any main axis orientations other than <100>, such as <110>, may be applicable. Also note that, as the wafer diameter, any diameters other than 300 mm, such as 200 mm and 450 mm, may be applicable.

In the slicing step A, each of the above blocks is sliced using a wire saw to provide wafer-like substrates with a certain thickness.

Sliced wafer substrates are subjected to double side grinding in lapping step B thereby to ensure a certain degree of flatness. In the lapping step B, the wafer substrates are interposed between upper and lower grinding surface plates of a double side grinding machine, and both surfaces, i.e. the front surface and the back surface of each wafer substrate are ground while supplying slurry containing abrasive grains.

Wafer substrates having been flattened to a certain degree through the lapping step B are subjected to single side grinding step C, and the front surfaces thereof are further flattened. In the single side grinding step C, the front surfaces of wafer substrates are ground using a grinding stone containing diamond etc.

After ensuring the flatness of the single side grinding step C, wafer substrates are put into chamfering step D and the shapes of outer faces thereof are adjusted using grinding stone.

In the producing method according to the present embodiment, first double side polishing step E is provided which performs rough polishing simultaneously, before epitaxial growth step G, both surfaces of the wafer substrate having been completed the chamfering step D. In this first double side polishing step E, each wafer substrate is interposed between upper and lower polishing surface plates of a double side polishing apparatus, to which hard polishing pads are attached, and both surfaces of the wafer substrate are simultaneously polished under the condition of no abrasive grains or using free abrasive grains. The polishing amount in this first double side polishing step E is 5 to 30 μm, for example. This first double side polishing step E further improves the flatness of wafer substrates. This first double side polishing step E preferably involves polishing under the condition of no abrasive grains thereby allowing damages to be suppressed during the subsequent epitaxial growth. Such a damage control is significant for the integrity of epitaxial layer, and damages, if remain, contribute to stacking faults.

For the epitaxial growth step G, before supplying reactive gases into an epitaxial reactor furnace in which wafer substrates are set, halogenated gas is supplied into the reactor furnace to remove oxidized films having formed on the surface of the wafer substrates (etching step F). Note that, alternatively to the method of etching by supplying halogenated gas into the epitaxial reactor furnace, a wet etching step may be provided in which etching liquid for the oxidized films is dropped onto the wafer substrates.

In the epitaxial growth step G, the wafer substrates are set on susceptors in the epitaxial reactor furnace and the reactive gases are supplied thereby to form epitaxial layers on the surface of the wafer substrates.

Wafer substrates having formed thereon with epitaxial layers are sent to second double side polishing step H to be subjected to final polishing. The second double side polishing step H according to the present embodiment is comprised of double side simultaneous polishing step H1 and subsequent single side mirror polishing step H2.

Figure 2:
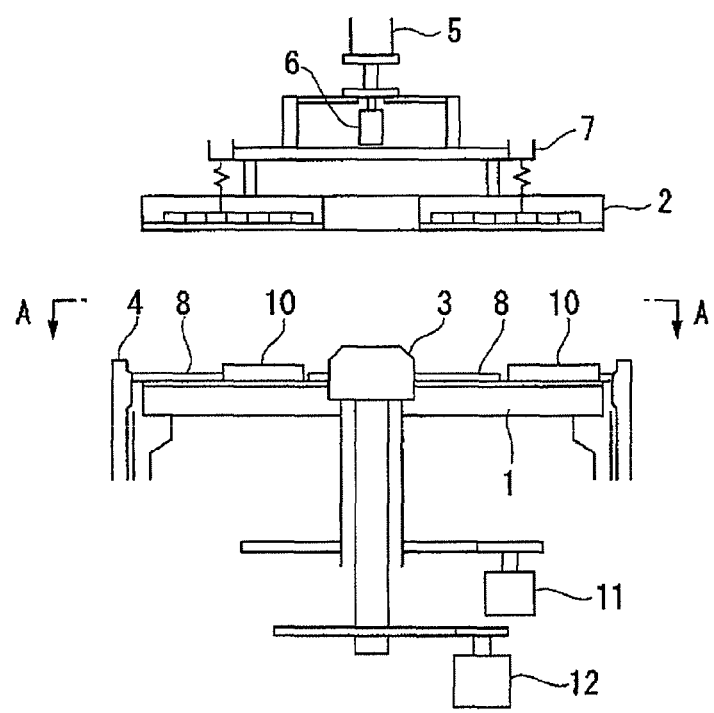
FIG. 2 is a front elevational view illustrating one example of a polishing apparatus which is applied to the double side simultaneous polishing step H1 in FIG. 1.
Figure 3:
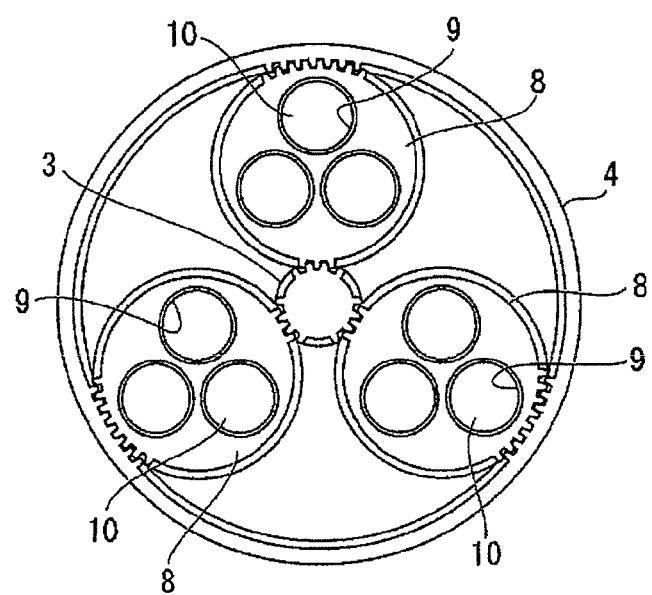
FIG. 3 is a plan view from line A-A in FIG. 2.

In the double side simultaneous polishing step H1, it is preferred to use a double side polishing apparatus and a polishing method as shown in FIG. 2 to FIG. 5. Hereinafter, one example of the polishing apparatus used in the double side simultaneous polishing step H1 will be described. FIG. 2 is a front elevational view illustrating one example of the polishing apparatus, and FIG. 3 is a plan view from line A-A in FIG. 2.

The polishing apparatus shown in FIG. 2 and FIG. 3 comprises: a circular lower polishing surface plate 1 supported horizontally; a circular upper polishing surface plate 2 facing the lower polishing surface plate 1 from above; a sun gear 3 positioned at the inside of the circular lower polishing surface plate 1; and a ring-like internally-toothed gear 4 positioned at the outside of the lower polishing surface plate 1.

The lower polishing surface plate 1 is rotatively driven by a motor 11. The upper polishing surface plate 2 is suspended from a cylinder 5 via a joint 6 to be rotatively driven in the opposite direction by another motor (not shown) different from the motor 11. In addition, a polishing liquid supply system is provided, which includes a tank 7 for supplying polishing liquid between the lower polishing surface plate 1 and itself. The sun gear 3 and the internally-toothed gear 4 are also independently driven by still another motor 12 different from the motors for driving the polishing surface plates.

Figure 5:
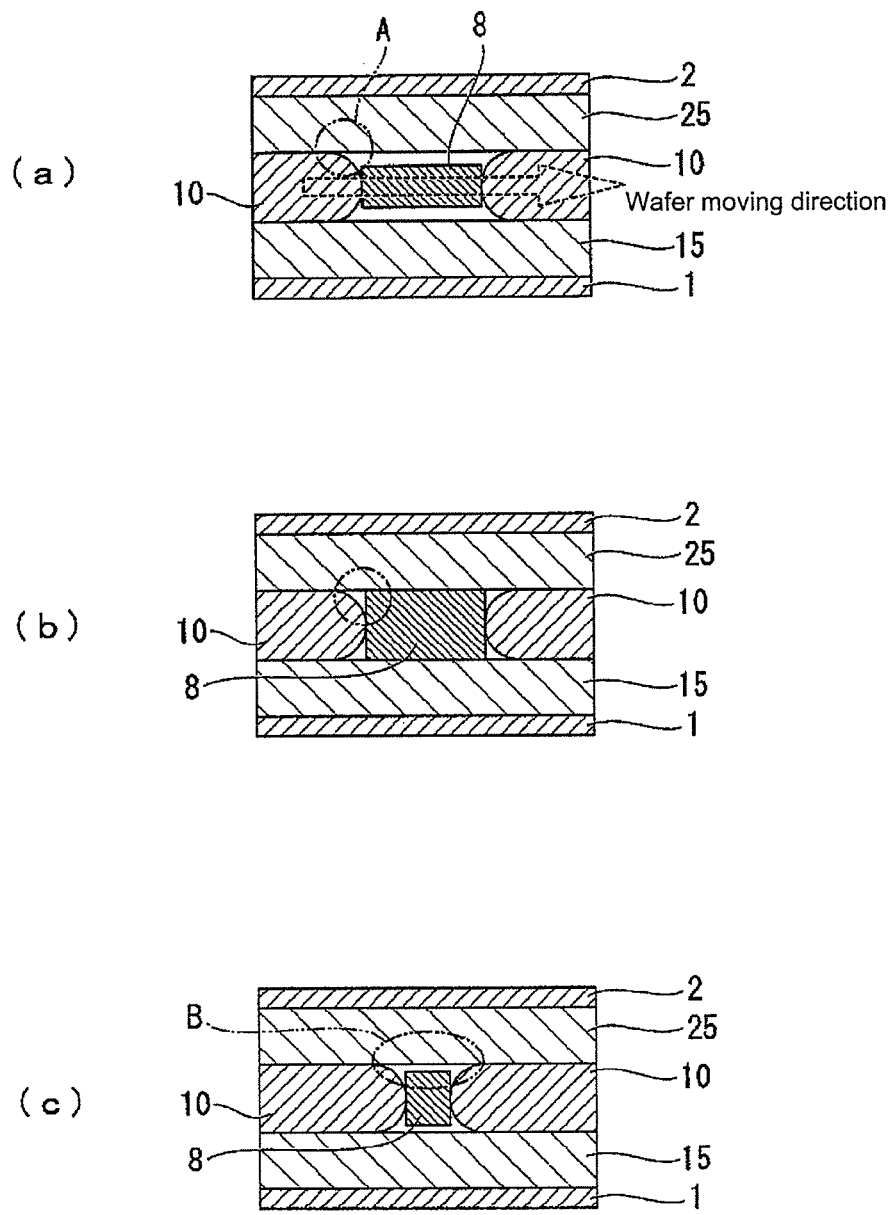
FIGS. 5(a), 5(b), and 5(c) are schematic cross-sectional views illustrating polishing statuses by the polishing apparatus in FIG. 2.

Facing surfaces of the lower polishing surface plate 1 and the upper polishing surface plate 2 are, as shown in FIG. 5 (*a*) to FIG. 5 (*c*), attached thereto pads (abrasive clothes) 15 and 25 each obtained by impregnating urethane resin into nonwoven fabric cloth, or pads (abrasive clothes) 15 and 25 comprised of urethane foams etc.

As shown in FIG. 3, a plurality of carriers 8 are set so as to surround the sun gear 3. Each carrier 8 having been set is provided so as to be engaged with the sun gear 3 at the inside and also with the internally-toothed gear 4 at the outside, respectively. Each carrier 8 is provided therein with holes 9 in an eccentric manner for accommodating wafer substrates 10. Moreover, the thickness of each carrier 8 is set as being equal to or slightly less than the target thickness value of the wafers 10 to be finally obtained.

When performing the polishing of wafer substrates 10, in the status where the upper polishing surface plate 2 is lifted up, a plurality of carriers 8 are set on the lower polishing surface plate 1 and the wafer substrates 10 are set into holes 9 of each carrier 8. The upper polishing surface plate 2 is then caused to move down to apply a predetermined pressing force to each wafer substrate 10. In this status, while supplying polishing liquid between the lower polishing surface plate 1 and the upper polishing surface plate 2, the lower polishing surface plate 1, the upper polishing surface plate 2, the sun gear 3, and the internally-toothed gear 4 are caused to rotate in predetermined directions with predetermined speeds.

This allows a sun-and-planet motion to run where the plurality of carriers 8 revolve around the sun gear 3 while each rotating between the lower polishing surface plate 1 and the upper polishing surface plate 2. The wafer substrates 10 held by each carrier 8 are contacted and rubbed with the abrasive clothes 15 and 25 in the polishing liquid, and both the upper and the lower surfaces are simultaneously polished. Polishing conditions are set such that both surfaces of each wafer substrate 10 are evenly polished and the plurality of wafer substrates 10 is evenly polished.

During the polishing, the torque of the motor 11 for driving the lower polishing surface plate 1 or the torque of the motor for driving the upper polishing surface plate 2 is monitored. Thereafter, when the monitored torque decreases from a stable value by a predefined fraction, such as 10% thereof, the upper polishing surface plate 2 is lifted up to complete the polishing. This allows the finally obtained thickness of the wafer substrates 10 to be accurately and stably controlled as being slightly thinner than or equal to the carrier thickness before polishing.

The carriers 8 possibly deteriorate due to the friction with the abrasive clothes 15 and 25 attached to the polishing surface plates 1 and 2, and therefore, the material for each carrier 8 is preferred to be a material which has a small friction coefficient with respect to the abrasive clothes 15 and 25 thereby to be of high anti-abrasion property, and of which the chemical resistance property is high in alkali polishing liquid of pH 8 to 12. As carrier materials fulfilling such requirements, stainless-steels, or FRPs obtained by combining resins, such as epoxy resin, phenol resin, polyimide resin, etc, with reinforcement fibers, such as glass fiber, carbon fiber, aramid fiber, etc, may be mentioned. In addition, the carriers 8 may have a certain degree of strength because they are used to hold the wafer substrates 10.

Figure 4:
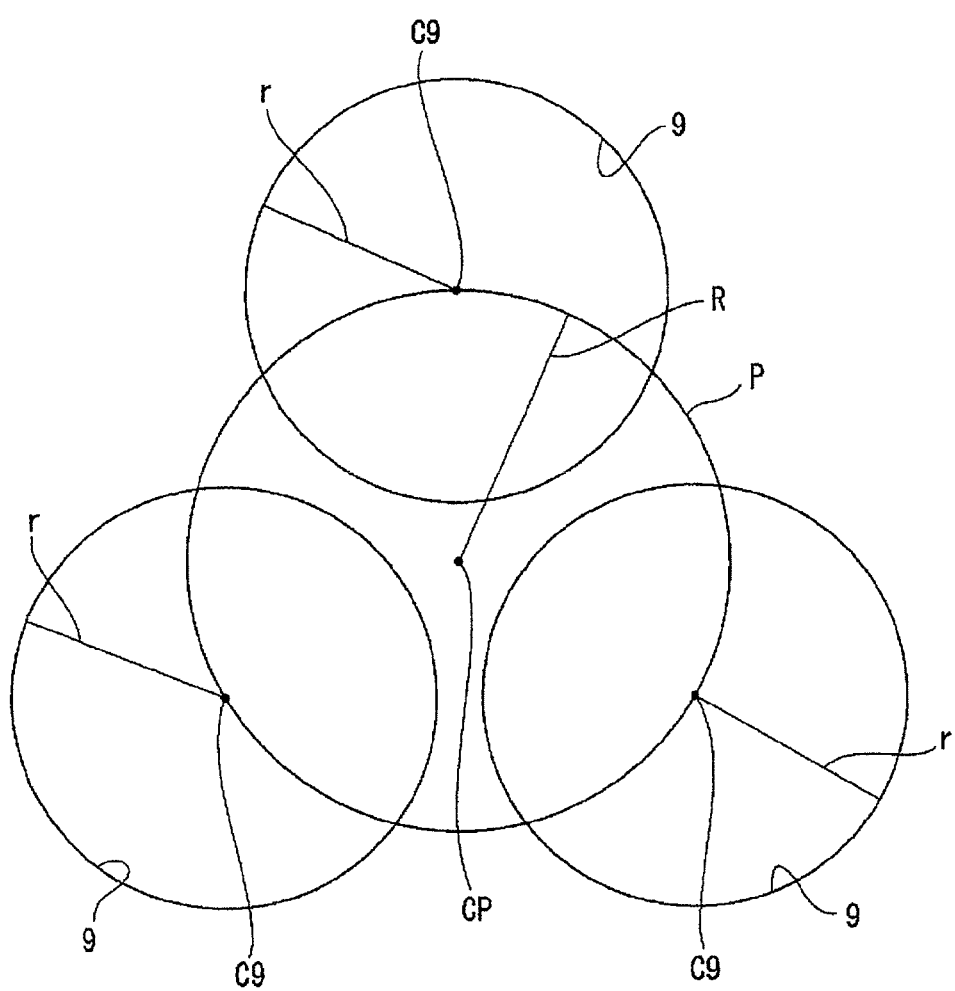
FIG. 4 is a plan view for explaining the positional relationship between a carrier and holes.

FIG. 4 is a plan view for explaining the method of polishing the wafer substrates 10 and a layout of the holes 9 in the carrier 8, according to the present embodiment.

The three holes 9 of each carrier 8 according to the present embodiment are arranged such that centers C9 thereof are positioned on a circle P as being concentric with the carrier 8 and also arranged along the circle P with equal intervals so as to be in a rotative point-symmetric fashion with respect to the center CP of the circle P (the center of the carrier 8).

Moreover, the size of the hole 9 is determined such that the area ratio of the circle P passing through the centers C9 of the holes 9 to each hole 9 substantially equal to the wafer substrate 10 is 1.33 or more and less than 2.0, and more preferred is 1.33 or more and 1.5 or less. That is, the radius R of the circle P and the radius r of the holes 9 are set to satisfy the expression below.

$1.33 \leq (R/r)^2 \leq 1.5$

Note that the lower limit of the defined range of this area ratio (square of the radius ratio) may be 1.3333 . . . or more, and may also be 1.334 or more.

If, in the carrier 8, the area ratio of the circle P passing through the centers C9 of the holes 9 to each hole 9 is less than the above range, then only two holes 9 are allowed to be provided in one carrier 8, and the processing of the wafer substrates 10 treated in the same carrier 8 may not thus be even, so that no advantageous effect for preventing edge-roll-off of the wafer substrates 10 is obtained, thereby not being preferred. Moreover, if the upper limit of that area ratio is set as being 2 or more when the holes 9 at three locations are provided in one carrier 8, then the distances among the wafer substrates 10 come to be too long, so that no advantageous effect for preventing edge-roll-off of the wafer substrates 10 is obtained, thereby not being preferred. Furthermore, if the upper limit of the area ratio is set as being 2 or more when the holes 9 at four locations or more are provided in one carrier 8, then the stress concentration may not be sufficiently distributed, so that no advantageous effect for preventing edge-roll-off of the wafer substrates 10 is obtained, thereby not being preferred. In addition, although the edge-roll-off may be prevented if the upper limit of the area ratio is set as being more than 1.5 and less than 2, it is more preferred to set the ratio as being 1.5 or less in order to obtain flatness sufficient to be product wafers.

Note that the dimensions of the wafers 10 and the holes 9 are to be substantially the same, for example, the diameter of the holes 9 is 201 mm for the wafer substrates 10 of $\phi$200 mm, and the diameter of the holes 9 is 302 mm for the wafer substrates 10 of $\phi$300 mm.

According to the present embodiment, the wafer substrates 10 are subjected to double side polishing using the carriers 8 formed therein with the holes 9 as described above to prevent edge-roll-off from occurring in the wafers 10 thereby to allow for producing polished wafers with high degree of flatness.

FIG. 5 (*a*) to FIG. 5 (*c*) are schematic cross-sectional views illustrating polishing statuses.

In the conventional polishing technique which involves a polishing step using carriers 8 thinner than wafer substrates 10, pressures from the abrasive clothes 15 and 25 are concentrated at outer edges A of the wafer substrates 10, one of which is denoted by symbol A in FIG. 5 (*a*), thereby causing edge-roll-off to occur in each wafer substrate 10 as a result. In addition, according to the polishing technique described in Jpn. Unexamined Patent Publication No. 2002-254299, as shown in FIG. 5 (*b*), a method is employed in which the pressures to be concentrated at outer edges A are distributed toward the vicinity of wafer substrates 10 and the carriers 8 by increasing the thickness dimensions of the carriers 8.

In contrast, according to the polishing method of the present embodiment, by closely arranging the holes 9 in the planar arrangement within each carrier 8 to concentrate the locations of the wafer substrates 10 toward the center of each carrier 8, as shown in FIG. 4 and FIG. 5 (*c*), the polishing pressures from the abrasive clothes 15 and 25 are allowed to be distributed toward adjacent wafer substrates 10 arranged close to each other as denoted by symbol B in FIG. 5 (*c*). Consequently, disadvantages in the conventional technique are suppressed that the productivity may be deteriorated due to decreasing of the polishing rate and that the control of the thickness of carriers may be required, etc, while on the other hand, edge-roll-off of the wafer substrates 10 may be prevented from occurring at the outer edge portions thereof.

This is considered as being due to that the distances among the wafer substrates 10 are made smaller in the status of eliminating the influence from the deformation of carriers 8 caused by the wafer substrates 10 during polishing, etc. Consequently, the concentration of polishing pressures from the abrasive clothes 15 and 25 on the surfaces of the polishing surface plates 1 and 2 to the wafer substrates 10 is suppressed from occurring in the vicinity of the position where adjacent wafer substrates 10 come to be most close to each other.

During operation of the polishing, at the position between a wafer substrate 10 and another wafer substrate 10, due to the difference in thickness between the wafer substrates 10 and the carrier 8, a status is provided where the abrasive clothes 15 and 25 on the surfaces of the polishing surface plates having flexibility are deformed to outstand toward the carrier 8 from the height (the position in the thickness direction) at the planar position of each wafer substrate 10. For this reason, the pressures from the abrasive clothes 15 and 25 may be concentrated at edge portions of the wafer substrates 10 thereby to increase the polishing amount at the edge portions of the wafer substrates 10.

According to the polishing method of the present embodiment, however, as shown in FIG. 5 (*c*), by making smaller the distance between the wafer substrates 10 (distance between the holes 9), the deformation amount of the abrasive clothes 15 and 25 are allowed to be decreased in the vicinity of the position where adjacent wafer substrates 10 are close to each other. Consequently, the present embodiment allows the pressure concentration at the outer edge portions of the wafer substrates 10 to be alleviated in the vicinity of the outer edge portions of the wafer substrates 10. As a result, the occurrence of edge-roll-off of the wafer substrates 10 may be reduced at the outer edge portions thereof.

This enables to easily and appropriately perform the polishing to a predetermined amount and to easily perceive the ending point of polishing, and to avoid the polishing pressure degradation to the wafer substrates 10 due to the decreasing of the pressure from the polishing surface plates to the carriers 8 even if during the latter half of the polishing step thereby to prevent the operation time efficiency/polishing efficiency from deteriorating, and also prevents the carriers 8 from being polished thereby to obtain long life-time thereof, and additionally avoids the flatness deterioration and the like by preventing the occurrence of edge-roll-off thereby enabling to produce the wafer substrates 10 having high flatness.

Moreover, during the polishing operation, in the vicinity of the border, as the outer edge portion of each wafer substrate 10, between the wafer substrate 10 and the carrier 8, due to the difference in thickness between the wafer substrate 10 being polished and the carrier 8, the abrasive clothes 15 and 25 on the surfaces of the polishing surface plates having flexibility are deformed to outstand toward the carrier 8 from the height (the position in the thickness direction) at the planar position of the wafer substrate 10. Consequently, the pressures from the abrasive clothes 15 and 25 may be concentrated in the vicinity of the edge portion of the wafer substrate 10 along the entire length of the outer edge portion of the wafer substrate 10, thereby to possibly cause the occurrence of the edge-roll-off of the wafer substrate 10.

According to the polishing method of the present embodiment, however, through decreasing the distances among the wafer substrates 10 to be subjected to the double side polishing and causing the wafer substrates 10 to be close to one another, it is enabled to approach the status where the wafer substrates 10 placed in three holes 9 within one carrier 8 are polished as if they are of one wafer substrate 10. This allows to limit the length where the stress concentration occurs relative to the entire outer edge length of one wafer substrate 10, that is, to reduce the area where the polishing condition within the outer edge portion of the wafer substrate 10 becomes to be significant because the pressures from the abrasive clothes 15 and 25 on the surfaces of the polishing surface plates 1 and 2 having flexibility are concentrated at the outer edge portion of the wafer substrate 10 due to the difference in thickness between the wafer substrate 10 and the carrier 8. Consequently, the polishing pressure concentration is allowed to be alleviated for the entire length of the edge portion of one wafer substrate 10 at the time of completing the polishing, and the occurrence of the edge-roll-off along the outer edge portion of each wafer substrate 10 is also allowed to be reduced, while polishing to the extent of allowing the damages and the depositions on the back surface to be removed.

Although the depicted example employs the configuration involving three carriers 8, other number thereof may also be applicable, and other than this, any configuration of a part of the polishing apparatus may also be applicable so long as the arrangement of the holes 9 or the wafer substrates 10 within each carrier 8 complies with the above structure.

Referring again to FIG. 1, in the double side simultaneous polishing step H1 of the second double side polishing step H, it is preferred that the polishing amount for the back surface of a silicon epitaxial wafer substrate is equal to or larger than the polishing amount for the front surface. For example, it is preferred that the polishing amount for the front surface of a wafer substrate is within the range of 0.01 to 0.1 μm, and the polishing amount for the back surface is within the range of 0.1 to 0.3 μm.

In the subsequent single side mirror polishing step H2, the front surface of the wafer substrate is subjected to a mirror polishing. The polishing amount in the mirror polishing is, for example, 0.01 to 0.2 μm.

Figure 6:
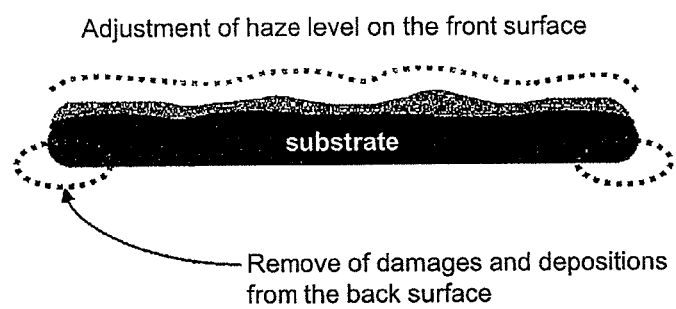
FIG. 6 is a cross-sectional view illustrating a wafer for explaining haze level and back surface defects to be improved according to the method of FIG. 1.

As described above, according to the method for producing a silicon epitaxial wafer in the present embodiment, the flatness of each wafer substrate is ensured, as shown in FIG. 6, by the double side polishing step E to be performed before the epitaxial growth step G. In addition, according to the double side simultaneous polishing step H1 to be performed after the epitaxial growth step G, the haze level of the surface of the wafer may be maintained without mirror polishing before the epitaxial growth step.

Figure 7:
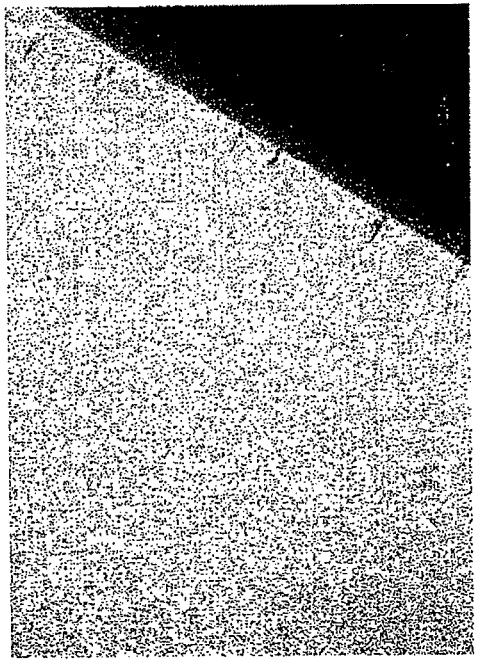
FIG. 7 depicts microscope observation photographs showing wafer back surface edge portions after the epitaxial growth step G and after the second double side polishing step H.
Figure 7:
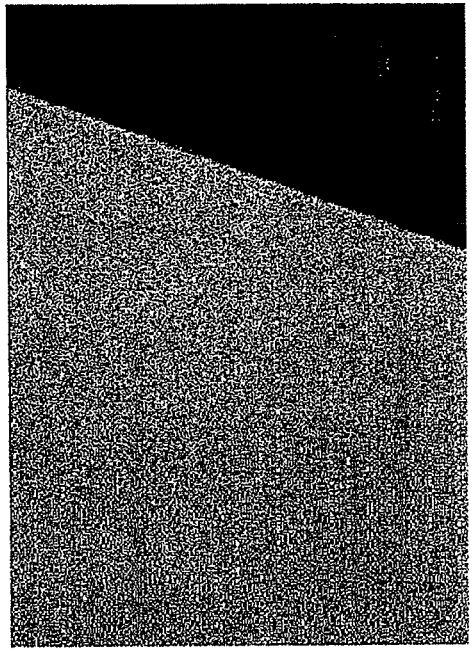

At the same time, the double side simultaneous polishing step H1 after the epitaxial growth may remove, as shown in FIG. 7, hitting flaws caused by susceptors in the epitaxial reactor furnace, which may occur on the back surface of each wafer, and also remove the depositions onto the back surface (back surface deposits), thereby suppressing the degradation of flatness and the occurrence of particles due to such flaws and depositions. Moreover, the double side simultaneous polishing step H1 removes irregularities due to hitting flaws and depositions on the wafer back surface thereby to improve the flatness of the back surface, and therefore, the polishing amount of the epitaxial layer on the front wafer surface comes to be uniform in that surface and the thickness of the epitaxial layer on the front surface also comes to be uniform.

Furthermore, the double side simultaneous polishing step H1 after the epitaxial growth allows the polishing amount of the wafer surfaces to be small as much as possible to the extent of removing an oxidized layer on the front surface, thereby maintaining the thickness of the epitaxial layer on the front surface to be even.

It is to be noted that the embodiments as explained above are described to facilitate understanding of the present invention and are not described to limit the present invention. Therefore, it is intended that the elements disclosed in the above embodiments include all design changes and equivalents to fall within the technical scope of the present invention.

EXAMPLES

Hereinafter, the above invention will be described with reference to further specified examples and comparative examples.

<<Preliminary Preparation>>

Through Czochralski pulling up method, a p-type silicon single crystal ingot was produced as having the main axis orientation of <100> and the diameter of 305 mm, and this ingot was peripherally ground into the diameter of 300 mm and then subjected to notch forming thereafter being cut into blocks with resistivity of 5 to 10 mΩcm. Each of these blocks was sliced using a wire saw to provide wafer substrates with a certain thickness.

The wafer substrates were interposed between upper and lower grinding surface plates of a double side grinding machine, and both surfaces, i.e. the front surface and the back surface of each wafer substrate were ground while supplying slurry containing abrasive grains (the lapping step B shown in FIG. 1). Then, the front surfaces of wafer substrates were ground using a grinding stone containing diamond (the single side grinding step C in FIG. 1).

Example 1

The wafer substrates ground in the above manner were interposed between upper and lower polishing surface plates of a double side polishing apparatus, to which hard polishing pads were attached, and both surfaces of the wafer substrates were simultaneously polished to 12 μm under the condition of no abrasive grains (the first double side polishing step (rough polishing) E in FIG. 1).

Then, before supplying reactive gases into an epitaxial reactor furnace in which wafer substrates completed with the first double side polishing step E were set, halogenated gas was supplied into the reactor furnace to remove oxidized films formed on the surfaces of the wafer substrates (etching step F in FIG. 1). Subsequently, the reactive gases were supplied thereby to form epitaxial layers with approximately 3 μm on the front surfaces of the wafer substrates (epitaxial growth step G in FIG. 1).

Thereafter, the wafer substrates formed thereon with epitaxial layers were set into the holes 9 of the carriers 8 of the double side polishing apparatus as shown in FIG. 2, and while supplying polishing liquid in the status of applying a predetermined pressing force to each wafer substrate 10, the lower polishing surface plate 1, the upper polishing surface plate 2, the sun gear 3, and the internally-toothed gear 4 were caused to rotate in predetermined directions with predetermined speeds (the double side simultaneous polishing step H1 in FIG. 1). At that time, the polishing amount of the front surfaces of wafer substrates were set as being 0.05 μm while being 0.2 μm for the back surfaces.

Finally, the front surfaces of wafer substrates were mirror polished (the single side mirror polishing step H2 in FIG. 1). The polishing amount of this mirror polishing was set to be 0.1 μm.

Figure 8:
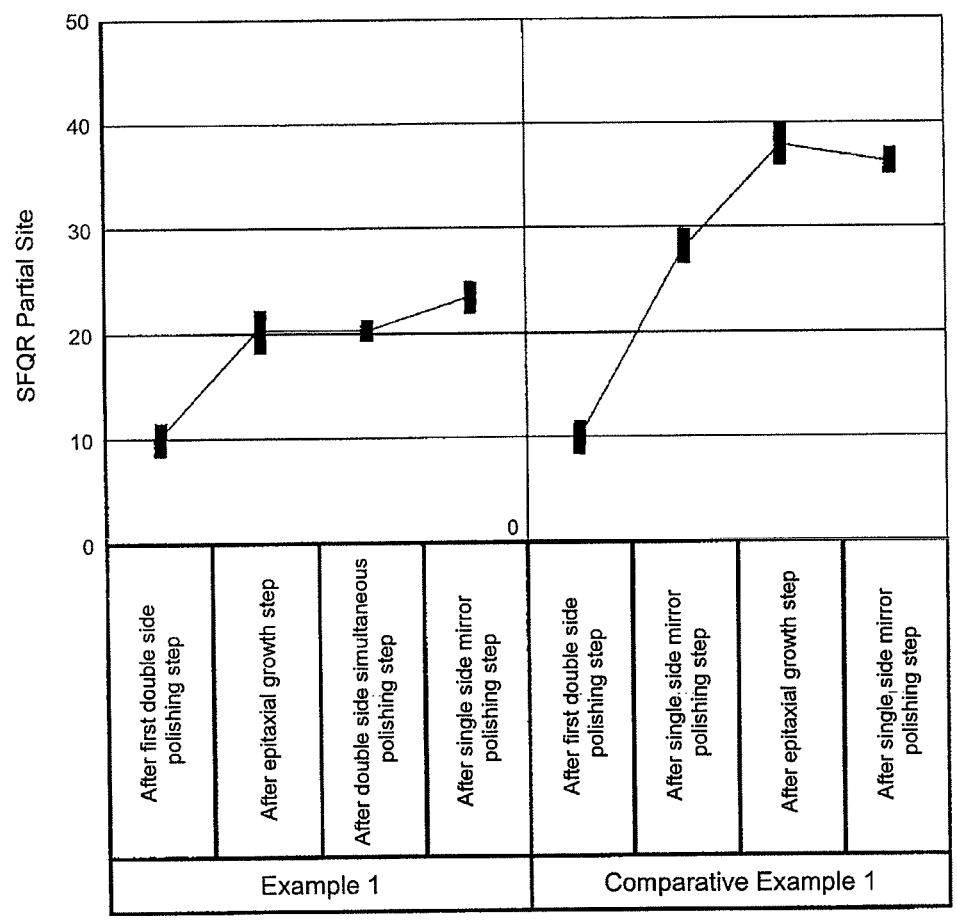
FIG. 8 is a graph illustrating flatness SFQR partial sites in an example of the present invention and a comparative example.

Among the above steps, the flatness (using partial sites for SFQR) was measured each after the first double side polishing step E, after the epitaxial growth step G, after the double side simultaneous polishing step H1, and after the single side mirror polishing step H2, and results thereof are shown in FIG. 8.

Partial sites for the flatness SFQR are intended to mean imperfect sites (sites of not being rectangular) due to that the wafer is circular, when one wafer surface is sectioned into sites of 25 mm×25 mm square shapes or 26 mm×8 mm rectangular shapes, for example. In this example, about fifty partial sites arose when sectioning the area of a 300 mm wafer except for the edge portion of 3 mm into 26 mm×8 mm rectangular sites. FIG. 8 shows values of flatness on the basis of these fifty partial sites as a general population.

When haze levels at the surfaces of epitaxial layers of the wafer substrates completed with the single side mirror polishing step H2 were tested at DWO mode (Dark Field Wide Oblique mode) using Unpatterned Wafer Surface Inspection System: trade name (model: Surf scan SP2) available from KLA-Tencor Corporation, they were 0.09 ppm (corresponding to 33 nm as SP2 detectable minimum particle diameter). In contrast, haze levels after the epitaxial growth step G were 0.3 ppm (corresponding to 39 nm as SP2 detectable minimum particle diameter), and good haze levels were thus confirmed.

Comparative Example 1

For comparison to the above Example 1, wafer substrates were prepared through steps in which the front surfaces of wafer substrates were mirror polished after the first double side polishing step (rough polishing) E in FIG. 1 and the double side simultaneous polishing step H1 in FIG. 1 was omitted. Other conditions were set to be the same as those of the above Example 1.

The flatness (using partial sites for SFQR) was measured each after the mirror polishing prior to the epitaxial growth step, after the epitaxial growth step G, and after the mirror polishing subsequent to the epitaxial growth step, and results thereof are shown in FIG. 8.

<<Consideration>>

From the results of FIG. 8, partial site flatness of each wafer substrate obtained through the steps of Example 1 was confirmed to be significantly better than those obtained through the steps of Comparative Example 1 as a conventional technique.

DESCRIPTION OF REFERENCE NUMERALS

1 . . . lower polishing surface plate
2 . . . upper polishing surface plate
3 . . . sun gear
4 . . . internally-toothed gear
8 . . . carrier
9 . . . hole
10 . . . silicon wafer substrate

The invention claimed is:

1. A method for producing a silicon epitaxial wafer, comprising:
    a growth step at which an epitaxial layer is grown on a silicon single crystal substrate;
    a first polishing step at which, before the growth step, both main surfaces of the silicon single crystal substrate are subjected to rough polishing performed by pressing force simultaneously under a condition of no abrasive grains; and
    a second polishing step at which, after the growth step, the both main surfaces of the silicon single crystal substrate are subjected to finish polishing simultaneously,
    wherein the first polishing step is the only polishing step performed in which the both main surfaces of the silicon single crystal substrate are subjected to the rough polishing performed by the pressing force simultaneously under the condition of no abrasive grains, before the growth step, and a polishing amount of the polishing performed by the pressing force under the condition of no abrasive grains in the first polishing step is 5 to 30 μm.

2. The method for producing a silicon epitaxial wafer as set forth in claim 1, wherein
    the second polishing step comprises: a first step at which the both main surfaces of the silicon single crystal substrate are polished; and a second step at which a front surface of the silicon single crystal substrate is subjected to mirror polishing.

3. The method for producing a silicon epitaxial wafer as set forth in claim 2, wherein
    the first step is a step in which a plurality of silicon single crystal substrates are held with respect to a carrier of a polishing apparatus such that centers of the plurality of silicon single crystal substrates are positioned on a same circle and an area ratio of the circle passing through the centers of the plurality of silicon single crystal substrates to one of the silicon single crystal substrates is 1.33 or more and less than 2.0 and polishing is performed by rotating the carrier between upper and lower rotating surface plates.

4. The method for producing a silicon epitaxial wafer as set forth in claim 3, wherein
    the carrier holds three silicon single crystal substrates.

5. The method for producing a silicon epitaxial wafer as set forth in claim 1, wherein
    the growth step includes an etching step at which, before growing the epitaxial layer, a front surface of the silicon single crystal substrate is etched by halogenated gas.

6. The method for producing a silicon epitaxial wafer as set forth in claim 1, further comprising
    an etching step at which, between the first polishing step and the growth step, a front surface of the silicon single crystal substrate is subjected to wet etching process.

7. The method for producing a silicon epitaxial wafer as set forth in claim 1, wherein
    a polishing amount of a back surface of the silicon single crystal substrate is equal to or larger than that of a front surface of the silicon single crystal substrate in the second polishing step.

8. The method for producing a silicon epitaxial wafer as set forth in claim 7, wherein
    the polishing amount of the back surface is 0.1 μm or more.

9. The method for producing a silicon epitaxial wafer as set forth in claim 7, wherein
    the polishing amount of the front surface is 0.1 μm or less.

* * * * *